(12) United States Patent
Lähteenmäki

(10) Patent No.: US 12,401,351 B2
(45) Date of Patent: Aug. 26, 2025

(54) QUBIT CLOCK SIGNAL GENERATION

(71) Applicant: IQM FINLAND OY, Espoo (FI)

(72) Inventor: Pasi Lähteenmäki, Espoo (FI)

(73) Assignee: IQM FINLAND OY, Espoo (FI)

( * ) Notice: Subject to any disclaimer, the term of this patent is extended or adjusted under 35 U.S.C. 154(b) by 0 days.

(21) Appl. No.: 18/560,008

(22) PCT Filed: Jun. 15, 2021

(86) PCT No.: PCT/FI2021/050448
§ 371 (c)(1),
(2) Date: Nov. 9, 2023

(87) PCT Pub. No.: WO2022/263704
PCT Pub. Date: Dec. 22, 2022

(65) Prior Publication Data
US 2024/0259002 A1    Aug. 1, 2024

(51) Int. Cl.
*H03K 3/38* (2006.01)
*G06N 10/40* (2022.01)
*H03L 7/099* (2006.01)
*H03L 7/183* (2006.01)

(52) U.S. Cl.
CPC .............. *H03K 3/38* (2013.01); *G06N 10/40* (2022.01); *H03L 7/099* (2013.01); *H03L 7/183* (2013.01)

(58) Field of Classification Search
CPC ........................................................ H03K 3/38
USPC .................................................... 331/107 S
See application file for complete search history.

(56) References Cited

U.S. PATENT DOCUMENTS 11,888,978 B1 * 1/2024 Wang ...................... G06F 1/105
2021/0272005 A1 * 9/2021 King ...................... G06N 10/70

FOREIGN PATENT DOCUMENTS

JP    2004071630 A    3/2004
WO   2008063100 A1   5/2008

OTHER PUBLICATIONS

International Search Report and Written Opinion issued in PCT/FI2021/050448, mailed Mar. 1, 2022.
(Continued)

*Primary Examiner* — Joseph Chang
(74) *Attorney, Agent, or Firm* — Meunier Carlin & Curfman LLC

(57) ABSTRACT

Example embodiments relate to generation of qubit clock signals. A superconductive phase detector may receive a reference frequency signal across a boundary of a cryogenic environment. A superconductive oscillator may be configured to generate a pulse clock signal based on an output of a low-pass filter electrically coupled to the output of the superconductive phase detector. A frequency divider may divide a frequency of the pulse clock signal to generate a feedback signal for the superconductive phase detector, which may generate its output based on a comparison of a phase of the reference frequency signal and a phase of the feedback signal. A pulse generator may generate a qubit drive pulse sequence based on the pulse clock signal. Apparatuses and methods are disclosed.

29 Claims, 8 Drawing Sheets

(56) References Cited

OTHER PUBLICATIONS

Ruffino et al., 13.2 A Fully-Integrated 40-nm 5-6.5 GHz Cryo-CMOS System-on-Chip with I/Q Receiver and Frequency Synthesizer for Scalable Multiplexed Readout of Quantum Dots, 2021 IEEE International Solid- State Circuits Conference, pp. 210-212.
Li et al., Scalable Hardware-Efficient Qubit Control with Single Flux Quantum Pulse Sequences, Phys. Rev. Applied 12, 2019, 10 pages.

\* cited by examiner

QUBIT CLOCK SIGNAL GENERATION

CROSS REFERENCE TO RELATED APPLICATIONS

The application is a U.S. National Stage application filed under 35 U.S.C. §371 of PCT/FI2021/050448, filed on Jun. 15, 2021.

TECHNICAL FIELD

Example embodiments generally relate to the field of example quantum computers. In particular, some embodiments relate to generation of qubit clock signals at a cryogenically cooled environment of a quantum computer based on an external reference frequency signal.

BACKGROUND

Quantum computing may involve processing information as qubits (quantum bits) stored in controllable and readable quantum mechanical states. Quantum processing circuits may be operated at a cryogenic environment, which has a sufficiently low temperature for establishing superconducting conditions. Qubit operations may be performed based on external clock signals delivered from outside the cryogenically cooled environment. Efficient upscaling of the number of superconducting qubits may require scaling down the amount of associated control electronics and their power consumption, or otherwise implementation of large scale quantum computers may be difficult due to technical, economic, or ecological reasons.

SUMMARY

It is an objective to improve scalability of quantum computing systems. This and further benefits may be achieved by the features of the independent claims. Further advantageous implementation forms are provided in the dependent claims, the description, and the drawings.

According a first aspect there is provided an apparatus. The apparatus may comprise: a superconductive phase detector configured to receive a reference frequency signal across a boundary of a cryogenic environment; a low-pass filter electrically coupled to an output of the superconductive phase detector; a superconductive oscillator electrically coupled to an low-pass output of the filter, wherein the superconductive oscillator is configured to generate a pulse clock signal based on the output of the low-pass filter; a frequency divider configured to divide a frequency of the pulse clock signal to generate a feedback signal, wherein the superconductive phase detector is configured to generate its output based on a comparison of a phase of the reference frequency signal and a phase of the feedback signal; and a pulse generator configured to generate a qubit drive pulse sequence based on the pulse clock signal.

According to an example embodiment of the first aspect, the pulse generator may be configured to generate the qubit drive pulse sequence based on qubit control data received across the boundary of the cryogenic environment.

According to an example embodiment of the first aspect, the qubit drive pulse sequence may comprise a quantum gate sequence, and the pulse generator may be configured to reset a phase of the pulse clock signal to the phase of the reference frequency signal at a beginning of the quantum gate sequence.

According to an example embodiment of the first aspect, the superconductive oscillator may comprise a tunable Josephson junction oscillator.

According to an example embodiment of the first aspect, the pulse generator may be configured to reset the phase of the pulse clock signal based on driving a bias current of the Josephson junction oscillator substantially to zero.

According to an example embodiment of the first aspect, the frequency divider may comprise an integer frequency divider, wherein a divisor of the integer frequency divider is configured to be delta-sigma modulated between at least two integer values.

According to an example embodiment of the first aspect, the pulse clock signal may comprise a first plurality of single flux quantum pulses.

According to an example embodiment of the first aspect, the qubit drive pulse sequence may comprise a second plurality of single flux quantum pulses.

According to an example embodiment of the first aspect, the superconducting phase detector may comprise a superconductor-insulator-superconductor mixer or a single flux quantum exclusive-or gate.

According to an example embodiment of the first the low-pass filter may be configured to aspect, substantially maintain its electric or electromagnetic state for a duration of the reset of the phase of the pulse clock signal.

According to an example embodiment of the first aspect, the duration of the reset of the phase of the pulse clock signal may be shorter than $1/10 f_c$ or $1/100 f_c$, wherein $f_c$ is a cut-off frequency of the low-pass filter.

According to an example embodiment of the first aspect, the apparatus may further comprise: a plurality of phase locked loops configured to receive the reference frequency signal and to generate a plurality of pulse clock signals for a plurality of qubits based on the reference frequency signal, wherein each of the plurality of pulse clock signals corresponds to an integer multiple of a resonance frequency of a respective qubit; and a plurality of pulse generators configured to generate a plurality of qubit drive pulse sequences for the plurality of qubits based on the plurality of pulse clock signals.

According to an example embodiment of the first aspect, each of the plurality of phase locked loops may comprise an instance of the superconductive phase detector, an instance of the low-pass filter, an instance of the superconductive oscillator, and an instance of the frequency divider.

According to an example embodiment of the first aspect, each of the plurality of pulse generators may be configured to receive a portion of the qubit control data across the boundary of the cryogenic environment over a transmission medium and to generate the qubit drive pulse sequence based on the portion of qubit control data.

According to an example embodiment of the first aspect, the plurality of qubit drive pulse sequences may comprise a plurality of quantum gate sequences.

According to an example embodiment of the first aspect, the transmission medium may comprise a twisted conductor pair or a coaxial cable.

According to a second aspect there is provided a method. The method may comprise: receiving, by a superconductive phase detector, a reference frequency signal across a boundary of a cryogenic environment; filtering an output of the superconductive phase detector with a low-pass filter; generating, by a superconductive oscillator, a pulse clock signal based on an output of the low-pass filter; dividing a frequency of the pulse clock signal to generate a feedback signal; generating the output of the superconductive phase detector based on a comparison of a phase of the reference frequency signal and a phase of the feedback signal; and generating a qubit drive pulse sequence based on the pulse clock signal.

According to an example embodiment of the second aspect, the method may further comprise: generating the qubit drive pulse sequence based on qubit control data received across the boundary of the cryogenic environment.

According to an example embodiment of the second aspect, the qubit drive pulse sequence may comprise a quantum gate sequence, and the method may further comprise resetting a phase of the pulse clock signal to the phase of the reference frequency signal at a beginning of the quantum gate sequence.

According to an example embodiment of the second aspect, the superconductive oscillator may comprise a tunable Josephson junction oscillator.

According to an example embodiment of the second aspect, the method may further comprise: resetting the phase of the pulse clock signal based on driving a bias current of the Josephson junction oscillator substantially to zero.

According to an example embodiment of the second aspect, the duration of resetting the phase of the pulse clock signal may be shorter than $1/10 f_c$ or $1/100 f_c$, wherein $f_c$ is a cut-off frequency of the low-pass filter. According to an example embodiment of the second aspect, the method may further comprise: dividing the frequency of the pulse clock signal by an integer frequency divider, wherein a divisor of the integer frequency divider is delta-sigma modulated between at least two integer values.

According to an example embodiment of the second aspect, the pulse clock signal may comprise a first plurality of single flux quantum pulses.

According to an example embodiment of the second aspect, the qubit drive pulse sequence may comprise a second plurality of single flux quantum pulses.

According to an example embodiment of the second aspect, the superconducting phase detector may comprise a superconductor-insulator-superconductor mixer or a single flux quantum exclusive-or gate.

According to an example embodiment of the second aspect, the method may further comprise: receiving, by a plurality of phase locked loops, the reference frequency signal; generating, by the plurality of phase locked loops, a plurality of pulse clock signals for a plurality of qubits based on the reference frequency signal, wherein each of the plurality of pulse clock signals corresponds to an integer multiple of a resonance frequency of a respective qubit; and generating, by a plurality of pulse generators, a plurality of qubit drive pulse sequences for the plurality of qubits based on the plurality of pulse clock signals.

According to an example embodiment of the second aspect, the method may further comprise: receiving, by each of the plurality of pulse generators, a portion of the qubit control data across the boundary of the cryogenic environment over a transmission medium; and generating, by each of the plurality of pulse generators, the qubit drive pulse sequence based on the portion of qubit control data.

According to an example embodiment of the second aspect, the plurality of qubit drive pulse sequences may comprise a plurality of quantum gate sequences.

According to an example embodiment of the second aspect, the transmission medium may comprise a twisted conductor pair or a coaxial cable.

According to a third aspect there is provided an apparatus. The apparatus may comprise means for receiving, by a superconductive phase detector, a reference frequency signal across a boundary of a cryogenic environment; means for filtering an output of the superconductive phase detector with a low-pass filter; means for generating, by a superconductive oscillator, a pulse clock signal based on an output of the low-pass filter; means for dividing a frequency of the pulse clock signal to generate a feedback signal; means for generating the output of the superconductive phase detector based on a comparison of a phase of the reference frequency signal and a phase of the feedback signal; and means for generating a qubit drive pulse sequence based on the pulse clock signal. The apparatus may further comprise means for performing any example embodiments of the method of the second aspect.

Any example embodiment may be combined with one or more other example embodiments. Many of the attendant features will be more readily appreciated as they become better understood by reference to the following detailed description considered in connection with the accompanying drawings.

BRIEF DESCRIPTION OF THE DRAWINGS

The accompanying drawings, which are included to provide a further understanding of the example embodiments and constitute a part of this specification, illustrate the example embodiments and together with the description help to explain principles of the example embodiments. In the drawings.

Like references are used to designate like parts in the accompanying drawings.

DETAILED DESCRIPTION

Figure 1:
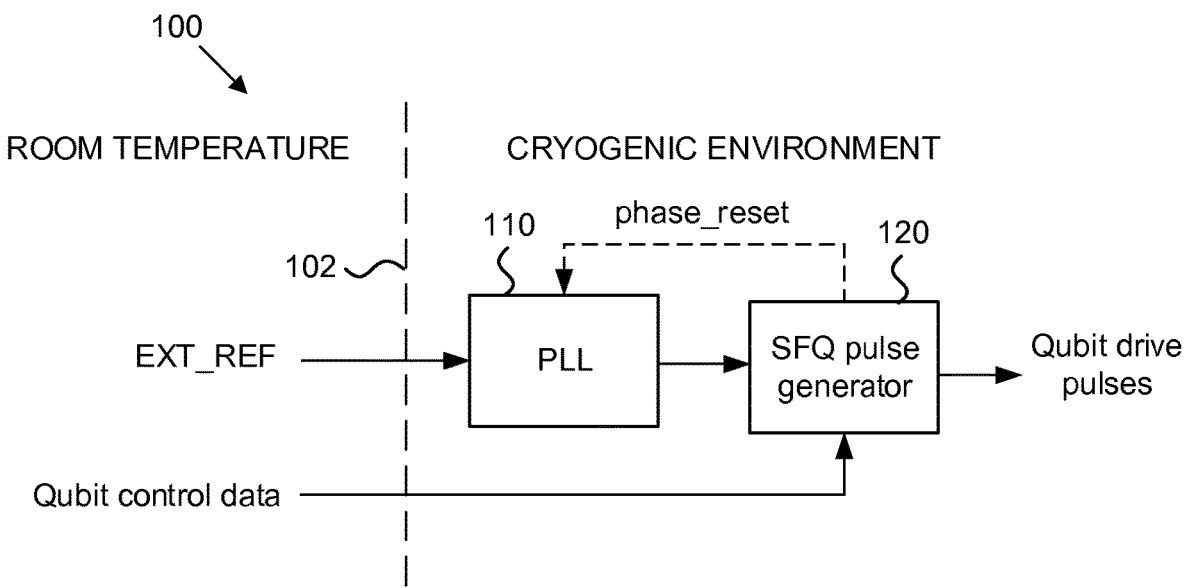
FIG. 1 illustrates an example of an apparatus for quantum computing comprising a phase-locked loop at a cryogenic environment.

Quantum processing circuits may be operated at a cryogenic environment (e.g. a cryostat) at an extremely low temperature, which may be generated for example by a dilution refrigerator, where different isotopes of Helium ($^3$He/$^4$He) are provided in a mixing chamber of the dilution refrigerator to cryogenically cool the environment of the mixing chamber to cryogenic temperatures, for example in the order of a few millikelvins (mK). Qubit driving may comprise providing input or control signals to quantum logic gates of a quantum processing circuit, or in general to facilitate gates, be they single-qubit, two-qubit, or multi-qubit gates.

Control electronics of a quantum computer may reside outside the cryogenic environment, for example at room temperature, and consume significant amount of power per qubit. The control electronics may also occupy a large amount of space. In such a system, the cost per qubit channel may be significant and there may be also technical difficulties associated with having analog control electronics at a distance at the room temperature environment, instead of the control electronics being located close to the qubits at the cryogenic environment. Placing the control electronics at the cryogenic environment, for example mounted to the mixing chamber, may be desired to improve signal fidelity, decrease latency, and solve issues related to signal connectivity. However, limited cooling power available at the mixing chamber may preclude the possibility of using complementary metal-oxide-semiconductor (CMOS) based electronics. It may be therefore desired to utilize more efficient electronics that operate much closer to the Landauer limit.

Increasing the number of superconducting qubits stored in dilution refrigerators may further aggravate the issues associated with delivery of data and control signals to the cryogenic environment. For example, qubit clock signals may be conveyed to the cryogenic environment by coaxial cables with rigid metal body and a centre conductor, which may be difficult to thermalize and which may conduct heat between higher temperature stages and the cryogenic environment. The example embodiments disclosed herein enable improving scalability of the number of superconducting qubits in quantum computers.

Qubits may be efficiently controlled by single flux quantum (SFQ) pulses, which may be Gaussian voltage pulses whose time integral is substantially equal to the superconducting flux quantum. SFQ based flux pulse driving of qubits may however involve using external microwave signals for clocking the logic close to multiples of the qubit resonant frequencies. Therefore, a large number of high fidelity microwave signals may need to be derived and therefore implementation of such a system may be difficult. One approach is to utilize a static clock across a large number of channels and to perform the gate pulses by utilizing complex error minimizing protocols such as SCAL-LOPS. The number of possible frequencies may however need to be limited in order to avoid introducing significant errors. While qubits may be in principle tuned to match these frequencies, flexibility of operating a quantum processing unit (QPU) may be improved.

Example embodiments of the present disclosure enable to integrate the active electronics associated with creation of analog microwave control pulses into a compact monolithic superconducting logic design that is optimized for power, space, and fidelity, thereby enabling to control a large number of qubits at the mixing chamber plate of the dilution refrigerator. Using superconducting logic, a phase locked loop(s) (PLL) may be provided alongside with fractional divider(s), implemented for example with delta-sigma-modulation of integer divisors, to enable accurate programming of the PLL(s) to match integer multiple(s) the qubit resonance frequency. A controllable superconductive oscillator, such as for example a tunable Josephson oscillator, may be then used to clock the associated SFQ pulse generator at the optimal frequency, thus facilitating coherent driving of qubits without need for any complex qubit drive protocols. This enables reducing complexity and power consumption the of control electronics associated with qubit driving, which in turn enables to scale up the number of qubits and qubit channels.

According to an example embodiment, a superconductive phase detector may receive a reference frequency signal across a boundary of a cryogenic environment. The superconductive detector may be located at a cryogenic environment. A superconductive oscillator may be configured to generate a pulse clock signal based on an output of a low-pass filter electrically coupled to the output of the superconductive phase detector. A frequency divider may divide a frequency of the pulse clock signal to generate a feedback signal for the superconductive phase detector, which may generate its output based on a comparison of a phase of the reference frequency signal and a phase of the feedback signal. A pulse generator may generate a qubit drive pulse sequence based on the pulse clock signal. Qubit drive pulse sequences may be thus generated based on pulse clock signals corresponding to integer multiples of different qubit frequencies and the pulse clock signals may be derived from a single external reference frequency signal.

FIG. 1 illustrates an example of an apparatus for quantum computing comprising a phase-locked loop at a cryogenic environment. Even though the apparatus 100 has been illustrated to include particular components, some of the components may not be present in every embodiment and the apparatus 100 may further comprise components not illustrated in FIG. 1. The apparatus 100 may comprise a quantum computer or a portion thereof, for example a module, a component, or a set of components configured to be applied at a quantum computer.

The apparatus 100 may be located (at least partially) at a cryogenic environment at an extremely low temperature. As used herein, the terms (extremely) low temperature and cryogenic environment may relate to the required operating temperature of the electronic devices of a quantum processing circuit of a quantum computer. For example, these terms may relate to the critical temperature of the superconductive materials involved, or depend on the thermal energy scales as compared to the quantum energy scales of the quantum electronic components involved. It is however noted that the cryogenic environment may not be initially or permanently cooled to the low temperature. The cryogenic environment may therefore generally comprise a cryogenically coolable environment.

The apparatus 100 may receive signals from outside the cryogenic environment (e.g. from room temperature) across the boundary 102 of the cryogenic environment. The designation "room temperature" should not be however taken as a limitation that would actually require the environmental conditions in the room temperature environment to correspond to those in rooms where people live and work in. It is more an indication that the conditions to the left in FIG. 1 do not require cryogenic cooling to the temperatures found in the cryogenic environment. Hence, the room temperature environment of FIG. 1 is generally provided as an example of a non-cryogenic environment.

As mentioned above, the environmental conditions in the cryogenic environment may involve an extremely low temperature, such as for example only a few kelvins, for example 4 K, or even less than one kelvin, for example in the order of millikelvins. The lowest temperature, which may be for example approximately 10 mK, may exist in only a part of the cryogenic environment, as there may be cooled stages of progressively lower temperatures. The qubits may be located for example at a mixing chamber (MXC) stage, which may be at the 10 mK temperature and be the coldest stage of the cryogenic environment. In general, temperature of this stage may be for example above 5 mK and below 100 mK. The superconductive components described herein may be provided at this stage. However, some fridges may also have nuclear magnetically cooled stage(s) that are even colder, and in some embodiments the superconductive components may be provided at such stage(s). In general, a dilution refrigerator may comprise several temperature stages, such as still, 4 K plate, cold plate, and others, which depending on the implementation may or may not house some or all of the components described herein. Saying that some part of the system is located within the cryogenic environment may not take position concerning at which of such stages that part is located. The environmental conditions in the cryogenic environment may also involve high vacuum, because a surrounding high vacuum may be used as thermal insulation for maintaining the low temperatures involved.

The apparatus 100 may comprise a phase locked loop 110 (PLL), which may be located at the cryogenic environment. The PLL 110 may receive a reference frequency signal (EXT_REF) from the room temperature. The reference signal (EXT_REF) be frequency may therefore received across the boundary 102 of the cryogenic environment. It is however noted that, as described above, there may be various cooling stages between the room temperature and the cryogenic environment and therefore the boundary 102 may in practise comprise a region of different cooling stages between the non-cryogenic and cryogenic environments.

The apparatus 100 may further comprise an SFQ pulse generator 120, which is generally provided as an example of a pulse generator. The SFQ pulse generator 120 may be configured to generate qubit drive pulses based on the output of the PLL 110. Qubits may be efficiently controlled by SFQ pulses, which may be short Gaussian voltage pulses whose time integral is equal to the superconducting flux quantum. The SFQ pulse generator 120 may receive qubit control data from the room temperature and generate the qubit drive pulses based of the qubit control data, for example to implement quantum logic gates indicated in the qubit control data.

The SFQ pulse generator 120 may be electrically coupled to the PLL 110 to receive a pulse clock signal. The pulse clock signal may be used to clock the qubit drive pulses. The SFQ pulse generator 120 may further provide a phase reset signal to the PLL 110 in order to reset the phase of the PLL 110, for example for each quantum gate sequence, as will be further described below.

Figure 2:
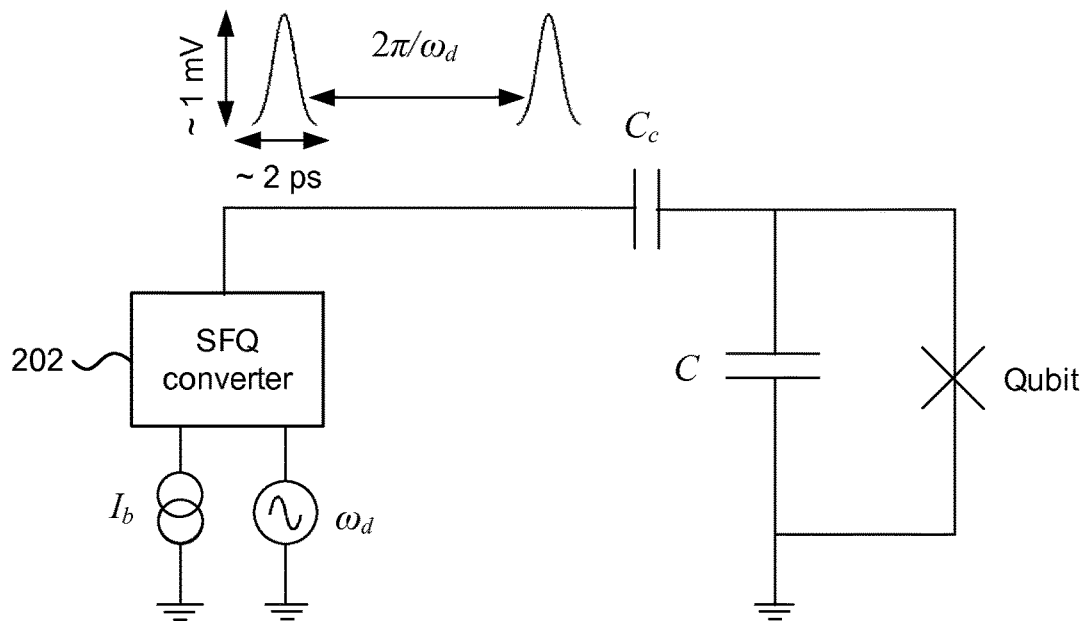
FIG. 2 illustrates an example of single-flux quantum (SFQ) based qubit driving.

FIG. 2 illustrates an example of single-flux quantum (SFQ) based qubit driving. The SFQ converter circuit 202 may be powered by a direct current (DC) bias current $I_b$ from the room temperature and driven with radio frequency (RF) pulses with frequency $\omega_d$ from the room temperature. These pulses may be converted by the SFQ converter circuit 202 into matching SFQ pulses. The SFQ-based qubit driving circuit may further comprise a first capacitor ($C_c$) in series with the qubit. The SFQ-based qubit driving circuit may further comprise a second capacitor (C) in parallel with the qubit. The pulses provided by the SFQ converter circuit 202 may have an amplitude of for example approximately 1 mV. Duration of an SFQ pulse may be for example approximately 2 ps. An interval between consecutive pulses of an SFQ pulse train may be approximately $2\pi/\omega_d$. SFQ pulses may have a constant amplitude, but the number of pulses, the dead time, and phase may be varied in discrete steps determined by the oversampling rate with respect to the qubit frequency. SFQ logic may be therefore advantageously used for operating the system at high multiples of qubit frequencies. For example, a qubit may have a resonance frequency of 4.5 GHZ, and the SFQ logic may be clocked at exact multiple of the qubit frequency, for example at 72 GHz or even higher.

Figure 3:
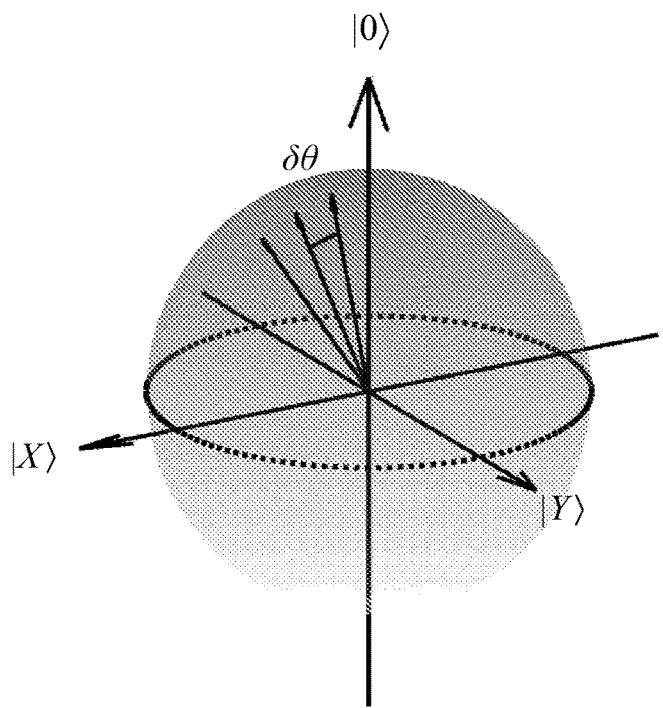
FIG. 3 illustrates an example of a qubit state on a Block sphere when driving a qubit with SFQ pulses.

FIG. 3 illustrates an example of a qubit state on a Block sphere when driving a qubit with SFQ pulses. An example of the state population of the qubit on the Bloch sphere is illustrated at different moments of time. Rotation of the Bloch vector occurs in discrete steps ($\delta\theta$), where each pulse causes a stepwise movement on the Bloch sphere. This may be calculated from repeated experiments, which yield statistics of finding the qubit in $|0\rangle$ or $|1\rangle$ state at different moments in time with respect to the SFQ pulse train.

Figure 4:
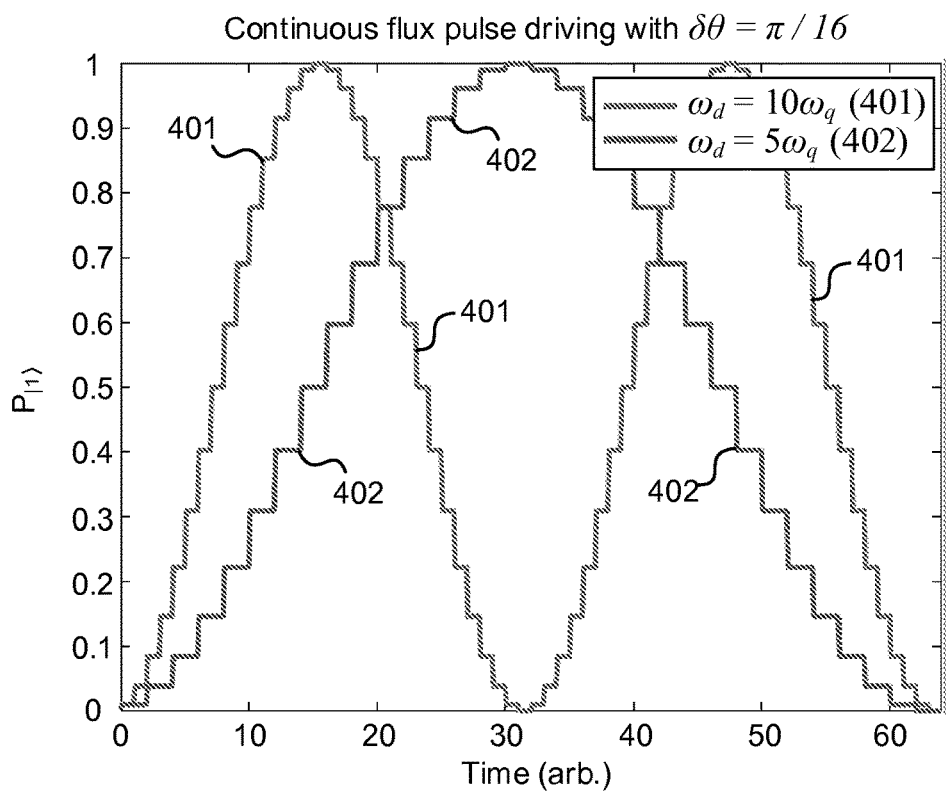
FIG. 4 illustrates an example of an excited state population of a qubit when driving the qubit with SFQ pulses.

FIG. 4 illustrates an example of an excited state population of a qubit when driving the qubit with SFQ pulses. The excited state population for continuous flux pulse driving with $\delta\theta=\pi/16$ is illustrated for two different integer multiples of the qubit frequency ($\omega_q$). Curve 401 illustrates the excited state population for $\omega_d=10\omega_q$ and curve 402 illustrates the excited state population for $\omega_d=5\omega_q$. The steps in the waveform originate from the fact that the rotation of the Bloch vector occurs in discrete steps by the individual flux pulses. It is noted that even though the excited state population describes the state of the qubit in a very partial and statistical manner, it provides an insight on the behaviour of the qubit. In general, the excited state population is just one parameter among many other parameters associated with multiple measurements on a qubit with particular history of interactions, which is in this example caused by the continuous driving with flux pulses.

Figure 5:
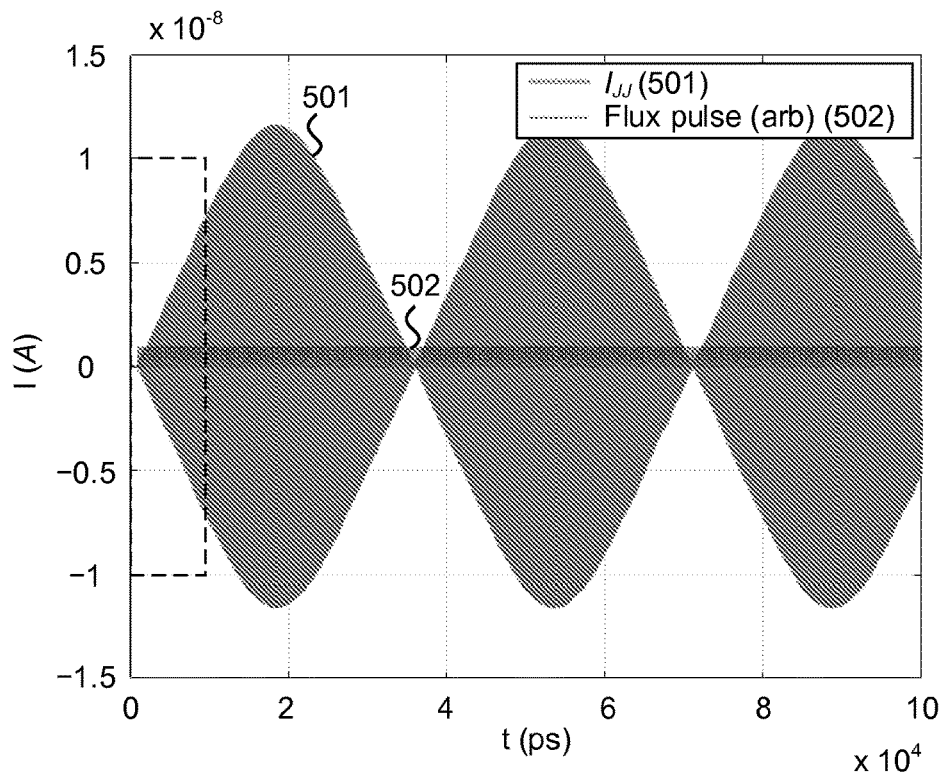
FIG. 5 illustrates an example of Rabi oscillation of a qubit.
Figure 6:
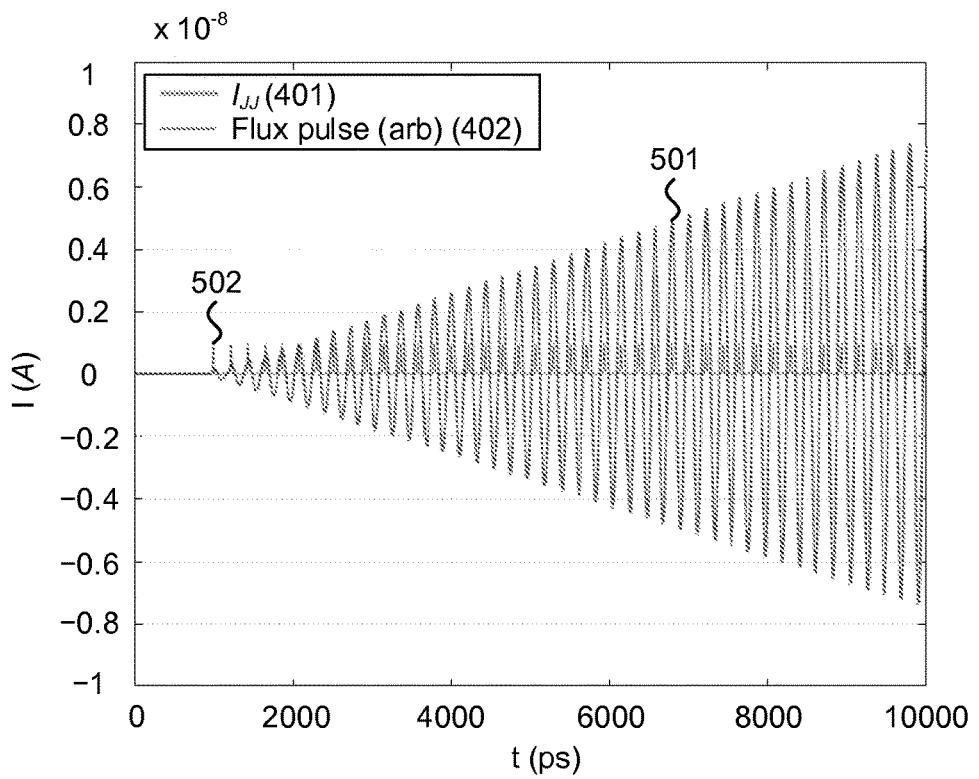
FIG. 6 illustrates a zoomed version of the example of Rabi oscillation.

FIG. 5 illustrates an example of Rabi oscillation of a qubit. Rabi oscillation was simulated with a train of SFQ pulses. Curve 501 illustrates the current of the qubit I(A) with respect to time (ps). Curve 502 illustrates the flux pulses from an arbitrary waveform generator (AWG) used for driving the qubit. The highest point of the qubit current I(A) corresponds to the point of time when a single photon has been driven to the qubit. When the driving with the SFQ pulses continues, the photon is taken out of the qubit and this behaviour repeats when continuing to further drive the qubit with the pulse sequence. A desired change of the state of the qubit may be caused by driving the qubit with a subset of the pulse train 502. For example, terminating the driving when the current of the qubit is at highest, corresponding to a $\pi$-pulse, may cause the Block vector of the qubit to rotate 180 degrees. By variating the duration of the pulse train (i.e. the number of pulses) and/or the phase of the pulses, a desired change may be caused to the state of the qubit, for example to implement a quantum logic gate. A zoomed version of the example of Rabi oscillation is illustrated in FIG. 6.

Figure 7:
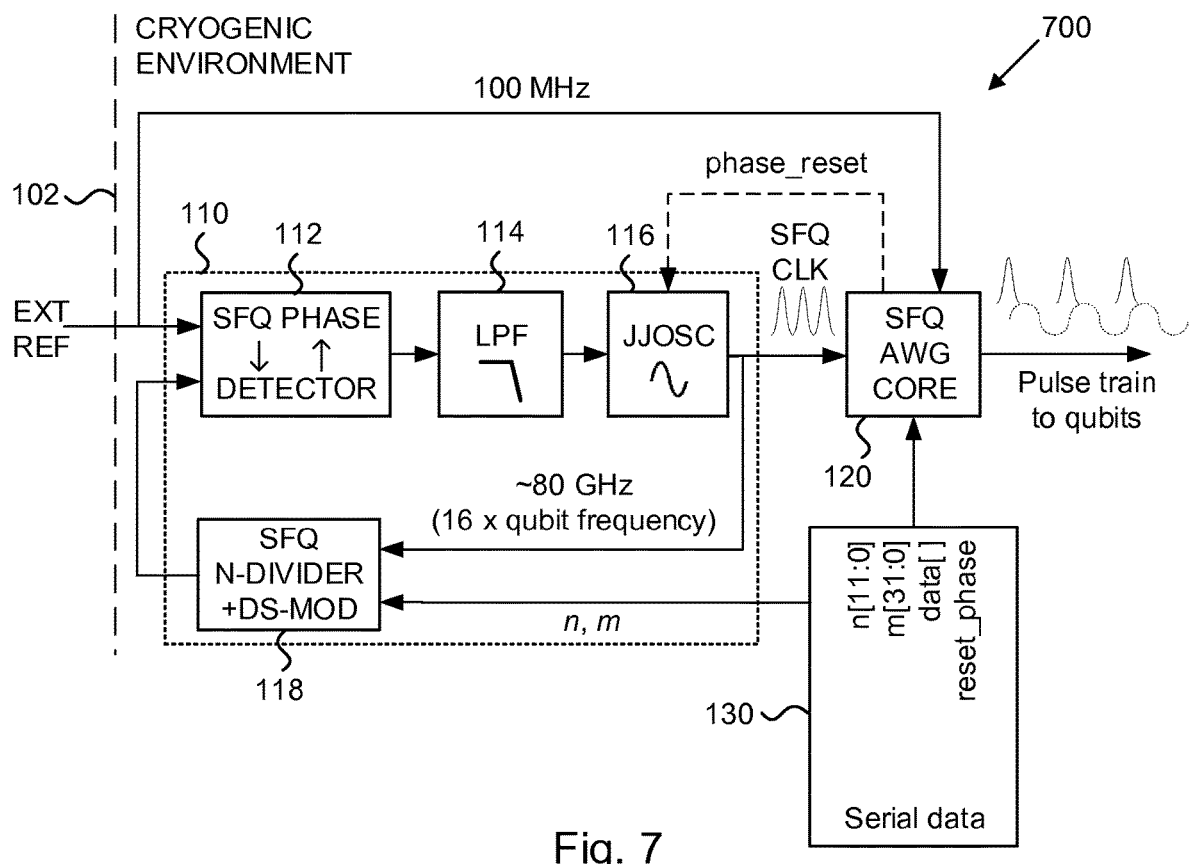
FIG. 7 illustrates an example of an apparatus with a Josephson junction oscillator based phase-locked loop.

FIG. 7 illustrates an example of an apparatus with a Josephson junction oscillator based phase-locked loop. The apparatus 700 may comprise a quantum computer or a portion thereof, for example a module, a component, or a set of components configured to be applied at a quantum computer. At least part of the apparatus 700 may be located at the cryogenic environment. The apparatus 700 may comprise the PLL 110 and the SFQ pulse generator 120, represented in this example by the SFQ arbitrary waveform generator (AWG) core. The apparatus 700 may further comprise a controller 130 (e.g. a serial data controller), which may be configured to provide the qubit control data to the SFQ AWG core 120 and/or to control the PLL 110.

An example of the PLL 110 is described with reference FIG. 7. It is however noted that similar to functionality may be implemented with different components. Furthermore, some of the components of the PLL 110 may not be present in some example embodiments.

The PLL 110 may comprise a phase detector 112. The phase detector 112 may be a superconductive phase detector. For example, the phase detector 112 may comprise superconductive materials, which become superconductive under the thermal conditions of the cryogenic environment. The phase detector 112 may be implemented in a number of different ways. The phase detector 112 may be for example implemented utilizing a superconductor-insulator-superconductor (SIS) mixer or an SFQ based exclusive-or (XOR) gate. The phase detector 112 may therefore generally comprise phase detection circuitry. The phase detector 112 may receive the reference frequency signal (EXT_REF) across the boundary 102. The reference frequency signal (EXT_REF) may therefore comprise an external reference frequency signal (external to the cryogenic environment). The reference frequency signal (EXT_REF) may for example comprise a clock signal having a certain frequency, for example 100 MHz.

The phase detector 112 may further receive, as another input, a feedback signal that is dependent on the output signal of the PLL 110 (pulse clock signal, SFQ CLK). The phase detector 112 may compare phases of the reference frequency signal (EXT_REF) and the feedback signal to generate its output. The output of the phase detector 112 may for example comprise an analog error signal whose DC-value is proportional to the phase error of the controllable oscillator of the PLL 110 with reference to the reference frequency signal (EXT_REF). The output of the phase detector 112 may however also contain alternative current (AC) components, which may be filtered before providing the output of the phase detector 112 as a control signal to the controllable oscillator of the PLL 110.

The PLL 110 may therefore further comprise a low-pass filter (LPF) 114. The LPF 114 may be electrically coupled to the output of the phase detector 112 and be configured to eliminate or suppress high frequency components present at the output of the phase detector 112. The LPF 114 may for example comprise an LCR filter comprising inductive (L), capacitive (C), and resistive (R) components.

The PLL 110 may further comprise a controllable (tunable) oscillator. The controllable oscillator may comprise a superconductive oscillator, which is in the example of FIG. 7 represented by a Josephson junction oscillator (JJOSC) 116. However, any suitable superconductive oscillator, such as for example an injection locked superconductive oscillator, may be applied instead. The JJOSC 116 may be electrically coupled to the output of the LPF 114. The electrical coupling to the LPF 114 may be optionally through one or more intermediate components such as for example an amplifier (not shown). The JJOSC 116 may generate the output signal of the PLL 110. Similarly, electrical coupling between any other components of the apparatus 700 may be through other components not illustrated in FIG. 7.

The JJOSC 116 may utilize the AC Josephson effect by which the Josephson junction of the JJOSC 116 acts as a voltage-to-frequency converter. External bias for the JJOSC 116 may be generated by feedback circuitry and fed back to the JJOSC 116 by adding the external bias to the bias voltage of the JJOSC 116. The feedback circuitry may comprise components for generating suitable bias offsets and bias environment for the JJOSC 116. The phase detector 112 and the LPF 114 may together generate the initial bias offset. Furthermore, the feedback circuitry may provide some attenuation and/or amplification which enable to match the bias offset signal optimally to tuning control characteristics of the JJOSC 116. The junction current of the JJOSC 116 may oscillate at a frequency of 484 GHz/mV. Feedback strength and filtering may affect the phase noise characteristics, which may be optimized for qubit control. For example, a certain range of parameters may be used to yield good practical steady state phase noise characteristics, while allowing the JJOSC 116 to phase lock successfully. The extent to which the bias is static and dynamic may determine the range of frequencies where it is possible for the JJOSC 116 to lock. The feedback derived bias therefore enables the JJOSC 116 to match the target frequency. The JJOSC 116 may therefore be a tunable JJOSC. The Josephson junction in the JJOSC 116 need not be perfectly voltage biased, since imperfect voltage bias through finite impedance results in harmonic content, which may even be beneficial for the application of conversion to optimal flux pulses for the SWG AWG core 120 and the feedback circuitry. The output of the JJOSC 116 may comprise a flux pulse based clock signal (SFQ CLK), which may serve a function similar to digital clock signals in CMOS based circuits. The SFQ CLK signal, also referred to as the pulse clock signal, may be used by the SFQ AWG core 120 to generate the qubit drive pulses. The JJOSC 116 may be therefore configured to generate a pulse clock signal based on the output of the LPF 114. The SFK CLK signal may comprise a sequence of SFQ pulses.

The SFQ AWG core 120 may be configured to generate the qubit drive pulse sequence based on the pulse clock signal. However, qubit drive pulses may not occur at every pulse of the pulse clock signal. For example, if the qubit frequency is 5 GHZ, the frequency of the pulse clock may be 80 GHz, which is an integer multiple of the qubit frequency. However, from hardware perspective, the 5 GHz clock frequency may not be needed. The programmed pulse trains may be designed such that the necessary information about whatever integer multiple the hardware is running at is taken into consideration. For example, if the multiple is 16, the qubit drive pulse waveform may contain one pulse for every 16 pulses of the SFQ CLK. This enables to drive Rabi oscillation and for a short pulse train to allow the qubit to acquire a particular phase, if starting from the ground state (zero) as illustrated in FIG. 3. The SFQ AWG core 120 may be therefore configured to generate the qubit drive pulse sequence in synchrony with the pulse clock signal, for example such that qubit drive pulses are generated for a subset of pulses of the SFQ CLK signal. The qubit drive pulses may therefore occur simultaneously with respective pulses of the SFQ_CLK signal. The number of the SFQ pulses of the qubit drive pulse sequence may be therefore lower than the number of the SFQ pulses of the pulse clock (SFQ_CLK) signal.

The pulse train may however further include other pulses, for example a more complex sequence of pulses programmed for a more complex change of the qubit state. Such pulses may be applied for example for correcting some error source. The pulse train may therefore generally contain any sequence of bits, which correspond to a signal with more complicated frequency content, i.e., not simply pulses at 5 GHz. This signal may be applied to cause any rotation of the qubits state vector. The change of the state vector is however not limited to rotation the state vector. The change may also address corrective measures, for example to compensate for leakage of energy to/from higher non-computational excited states.

The PLL 110 may further comprise a frequency divider, represented in the example of FIG. 6 by the SFQ divider 118. The SFQ frequency divider 118 may divide the frequency of the SFQ CLK signal and provide the frequency-divided signal as the feedback signal to the phase detector 112. The SFQ frequency divider 118 may output a signal whose frequency is lower (divided by a factor) than the input signal of the SFQ frequency divider 118. The SFQ frequency divider 118 may comprise a fractional frequency divider, which may be configured to divide the frequency of the SFQ CLK signal by a fraction.

The fractional frequency divider may be implemented for example based on an integer frequency divider, where the divisor r of the integer frequency divider is modulated between two consecutive integer values n1 and n2, for example by a delta-sigma (DS) modulator results in effective fractional division defined by programmable coefficients n and m. The JJOSC 116 may stabilize at frequency $f=f_{EXT\_REF}$. In other words, the JJOSC 116 may stabilize at a frequency between n1=n and n2=n+1 determined by m, when m is interpreted as a number between 0 and 1 and b being the number of bits used to express m. Numbers n1, n2, n, m may be integer numbers. The fractional frequency divider may comprise an integer divider, where the divisor of the integer divider is delta-sigma modulated between at least two integer values. For example, the delta-sigma modulation may cause the integer divider to switch between two integer values n1 and n2 with a certain pattern determined by the delta-sigma modulator. The delta-sigma pattern may depend on the order and coefficients of the delta-sigma modulator. The delta-sigma modulator may comprise for example a third order delta-sigma modulator. The delta-sigma modulator enables to shape the noise associated with the switching such that the noise power is moved towards higher frequencies in order to make it easier to low pass filter the feedback signal and to minimize undesired production of sidebands, which may otherwise occur as a result of the modulation. The SFQ frequency divider 118 may be implemented with SFQ logic gates. The SFQ frequency divider 118 may generally comprise frequency division circuitry.

The output of the SFQ frequency divider 118 may comprise a new flux pulse based clock signal with a frequency stabilizing to the reference frequency (EXT_REF), which may serve for similar function as digital clock signals in CMOS based logic. The SFQ frequency divider 118 therefore enables generation of pulse clock signals with different frequencies based on a single external reference frequency signal (EXT_REF).

The SFQ AWG core 120 may generate a qubit drive pulse sequence (pulse train) based on the SFQ CLK signal. The pulse train may comprise a sequence of SFQ pulses. In general, the SFQ AWG core 120 may comprise logic gates and memory for generating flux pulse sequences based on external instructions fed by a digital link from the room temperature. The apparatus 700 may however comprise, for example coupled to the input of the SFQ AWG core 120, SFQ circuitry (not shown) for converting non-SFQ digital signals into flux pulse based signals. Similar SFQ circuitry may be applied at any interface, where signals from the room temperature enter the SFQ logic. Similar SFQ circuitry may be also applied at the output of the JJOSC 116 to guarantee that the pulses entering the SFQ AWG core 120 and the SFQ frequency divider 118 receive proper pulse shapes.

The SFQ AWG core 120 may comprise a memory containing a set of bit strings and/or operation codes, which may represent particular flux pulse trains that are output in a particular order programmed by external control signals. These pulse trains may correspond to quantum logic gates when fed into a qubit. In general the SFQ AWG core 120 may store a plurality of quantum gate sequences. Based one the received control data, the SFQ AWG 120 may select a quantum gate sequence from its memory and generate a corresponding pulse train for driving the qubit. A filter may be applied at the output of the SFQ AWG core 120.

The SFQ AWG core 120 may therefore generate the pulse train based on qubit control data. The qubit control data may be received across the boundary 102. For example, the controller 130 may receive the qubit control data from the room temperature. The controller 130 may provide control data (data[ ]) to the SFQ AWG core 120, which may generate the pulse train accordingly.

The controller 130 may also provide a phase reset signal to the SFQ AWG core 120, for example at the beginning of one or more of the quantum gate sequences. In response to receiving the phase reset signal, the SFQ AWG core 120 may provide a phase reset signal to the JJOSC 116 to reset the phase of the SFQ CLK signal to the phase of the reference frequency signal (EXT_REF). The phase reset may be triggered for example synchronously to the rising edge of the reference frequency signal (EXT_REF).

The phase reset provides at least the following benefits. First, the phase reset enables to select a singular deterministic phase from the set of all possible phases the PLL 110 might otherwise lock into. For example, if the JJOSC 116 is running at 80 GHz, and the reference frequency is 100 MHZ, there are 800 different possible phases the PLL 110 might otherwise lock into. Second, the phase reset may be used to enable repetition of arbitrary length gate sequences with several parallel channels having different frequencies, where each parallel channel is caused to start with a known initial phase both with respect to the reference frequency signal (EXT_REF) and other SFQ CLK signals. The phase reset therefore enables phases of different SFQ CLK signals to be aligned for driving respective qubits. This increased determinism may be beneficial for example for error mitigation and error correction.

The SFQ AWG core 120 may also receive digital feedback signals from readout electronics (not shown), thereby enabling branching between different alternatives selectable by the SFQ logic within the SFQ AWG core 120 with low latency, for example based on table look-up. This may be used to implement low-latency error corrected quantum computation.

The controller 130 may be further configured to control the SFQ frequency divider 118, for example by providing the fractional frequency division parameters n and m to the SFQ frequency divider 118. The PLL 110 may be therefore configurable by the controller 130 to generate SFQ CLK signals with frequencies corresponding to different qubit frequencies, or integer multiples thereof.

In one example, the frequency of the SFQ CLK signal may be approximately 80 GHz. The SFQ CLK signal may be sixteen times the qubit frequency. Using integer multiples of the qubit frequency enables the stepwise SFQ pulse based qubit driving, as discussed for example with reference to FIG. 4 to FIG. 6.

The SFQ frequency divider 118 and the phase detector 112 may cause high sideband components, which may be detrimental to the operation of the SFQ AWG core 120 and qubit gate fidelity. The LPF 114 enables these unwanted components to be filtered, which improves quality of qubit driving.

Power consumption of the apparatus 700 may be reduced by utilizing low-power logic, for example adiabatic logic, whenever possible. An example of such technology is adiabatic quantum-flux-parametron (AQFP) which is compatible with more dissipative forms of SFQ, which may be utilized alongside with AQFP, for example at the analog output stages and oscillators. By using AQFP, power consumption may be scaled down near the quantum limit. For example, power consumption may be reduced to a level that is at least six orders of magnitude smaller compared to CMOS based solutions. Therefore, AQFP, optionally in combination with other SFQ technologies, may be utilized for implementing the disclosed control circuitry for quantum computers.

Alternative implementations for the JJOSC-based PLL of FIG. 7 include negative resistance based oscillators, which may be more dissipative compared to the JJOSC-based solution; frequency comb based techniques, which may come with difficulties with filtering and be in general more limited; SFQ-based delta-sigma clocking of the SFQ AWG core 120 instead of JJOSC 116, which may in some cases cause sideband errors that may be difficult to filter. Therefore, the JJOSC based PLL of FIG. 7 provides a good solution for enabling upscaling of the number of qubits.

Figure 8:
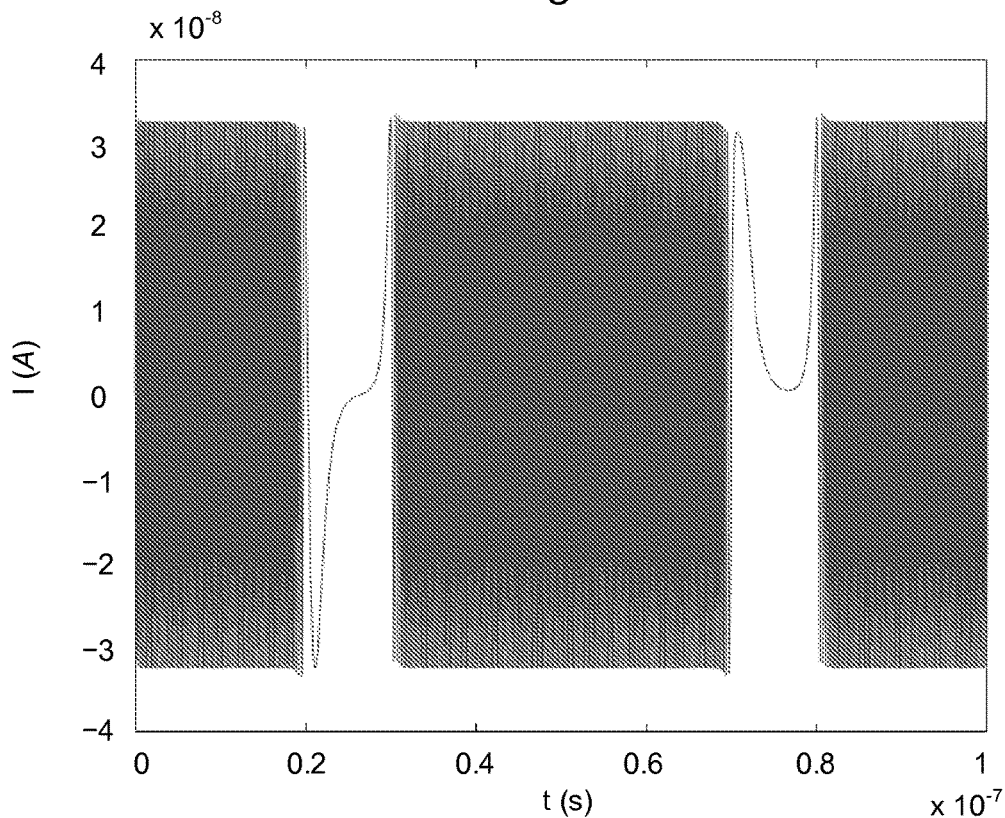
FIG. 8 illustrates an example of an output signal of a Josephson junction oscillator with a phase reset.
Figure 9:
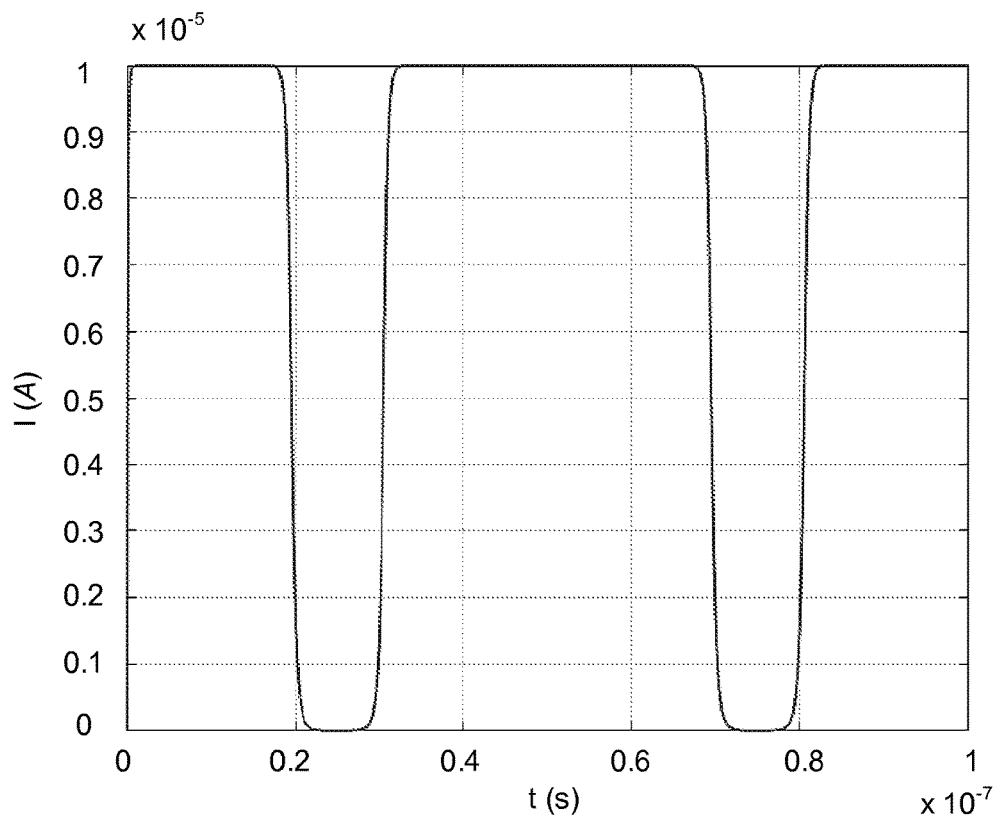
FIG. 9 illustrates an example of a bias current of a Josephson junction oscillator for causing a phase reset.

FIG. 8 illustrates an example of an output signal of a Josephson junction oscillator with a phase reset. A simulated output current (cf. SFQ CLK) of the JJOSC 116 is illustrated with respect to time over two phase resets initiated approximately at 20 ns and 70 ns. The output current of the JJOSC 116 is reset r to substantially zero, from which the oscillation continues after the phase reset. The phase reset may be implemented for example by driving the bias current of the JJOSC 116 substantially to zero, as illustrated in FIG. 9. Driving the bias current to substantially zero may cause the phase of the JJOSC 116 to be aligned with the phase of the reference frequency signal (EXT_REF). The bias current may be for example switched off/on synchronously with the reference frequency signal (EXT_REF). The off-period of the bias current may be called a reset pulse.

As the Josephson junction of the JJOSC 116 may involve complicated dynamics and it may store energy, both the current and the voltage across the Josephson junction may be driven to zero, in order to guarantee that there is no energy stored in the Josephson junction. Therefore, the phase reset may be implemented by driving both the bias current and the bias voltage substantially to zero. For example, a voltage may still exist across the Josephson junction even if the bias current were driven to zero. Therefore, driving the bias current to zero may not properly reset the phase in all situations. Similarly, even if the voltage were driven to zero, this may not guarantee that the current is zero. The phase reset circuitry may comprise for example two t-dependent resistors. One resistor may be configured to dissipate the energy in the junction. Even a short circuit may not reset the phase properly, because the Josephson junction is superconducting and therefore a current may keep flowing. The phase reset circuitry may therefore comprise a set of resistances configured to essentially disconnect the bias circuit and dissipate the energy in the Josephson junction.

It is observed from FIG. 8 that the frequency of the output current is initially stable and the phase relative to the phase of the reference frequency signal used to pulse the bias current is running. Pulsing the bias current synchronously with the reference frequency signal, for example at the rising edge of the reference frequency signal, drains the JJOSC 116 from energy and causes its phase to be reset relative to the reference frequency signal. For example, if the temporal distance between the reset pulses is 50 µs, then initially after 50 us the phase of a reference frequency of 100 MHz has returned back to 0, but the phase of 4.51231 GHz qubit clock (corresponding to 72.197 GHz when utilizing 16×SFQ clock) would have acquired a phase of mod (4.51231e9*50e−6, 2*π) rad, or approximately 296 degrees. The phase reset pulse enables to guarantee that after the phase reset pulse both the phase of the external reference clock (EXT_REF) and the phase of the output signal (SFQ_CLK) of the JJOSC 116 start from the same phase (zero). The reset pulse may pull both the junction voltage and current of the JJOSC 116 down.

Figure 10:
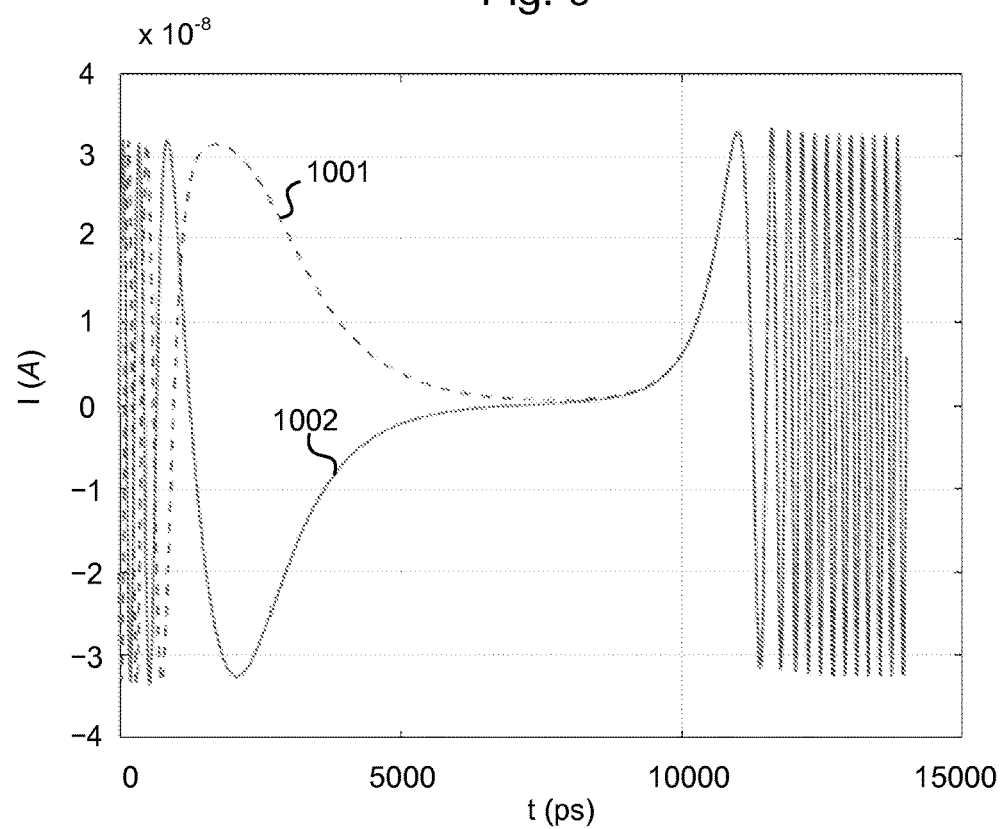
FIG. 10 illustrates an example of a zoomed version of an output signal of a Josephson junction oscillator with a phase reset.

FIG. 10 illustrates an example of a zoomed version of an output signal of a Josephson junction oscillator with a phase reset. The output signal of the JJOSC 116 (SFQ CLK) is illustrated by zooming in at two different locations temporally centred at the phase reset pulses. The individual reset pulses are separated by a time which does not correspond to the signal acquiring exactly equal phase during that period of time. In general, this can not be guaranteed for an arbitrary frequency when utilizing a static run time. Initially the oscillator phases are different, but after the phase reset, when the JJOSC 116 has recovered, the phases of the curves 1001 and 1002 are identical. This mechanism facilitates a globally clocked synchronized phase reset which may be utilized for example at the beginning of each quantum gate sequence or a subset of quantum gate sequences, for example periodically. A deterministic initial state of the PLL output at arbitrary programmable frequency may be therefore established. This may be used for example for synchronizing initial phases of individual quantum gate sequences.

A deterministic initial state of the oscillator (JJOSC 116), regardless of its frequency, may be accomplished without introducing significant phase relocking delay by engineering the loop filter (LPF 114) is not significantly such that its output current impacted by shunting of the oscillator bias current. The LPF 114 may be therefore configured to substantially maintain its electric or electromagnetic state during the phase reset. For example, the cut-off frequency ($f_c$) of the LPF 114 may be selected based on the duration ($t_{reset}$) of the phase reset, or vice versa, such that the LPF 114 is capable of maintaining its output state (e.g. current) for the duration of the phase reset. The duration of the phase reset may be inversely proportional to the cut-off frequency. However, to enable the LPF 114 to maintain its state, the phase reset may be configured to occur much faster than $1/f_c$. For example, if the cut-off frequency of the LPF 114 is 100 kHz, the reset pulse may be much shorter than 10 µs. So, in this example the duration of the phase reset may be for example 10 ns or 100 ns, but 10 us may be too long. Factor of 100 difference ($t_{reset} < 1/100 f_c$) may be sufficient to enable the LPF 114 to maintain its state during the phase reset. However, in some cases a longer duration, for example $t_{reset} < 1/10 f_c$, may be allowed, while still sufficiently maintaining the LPF state. This enables to implement the phase reset functionality such that the operation of the PLL 110 is not significantly affected by the phase reset. The LPF 114 therefore enables fast recovery of the JJOSC 116 from the phase reset, which drains the JJOSC 116 of energy, but does not significantly alter the electric or electromagnetic state of the LPF 114. In general, the duration of the phase reset may range from 1 ns to 1 µs. The cut-off frequency may range from 100 Hz to 1 MHZ.

Figure 11:
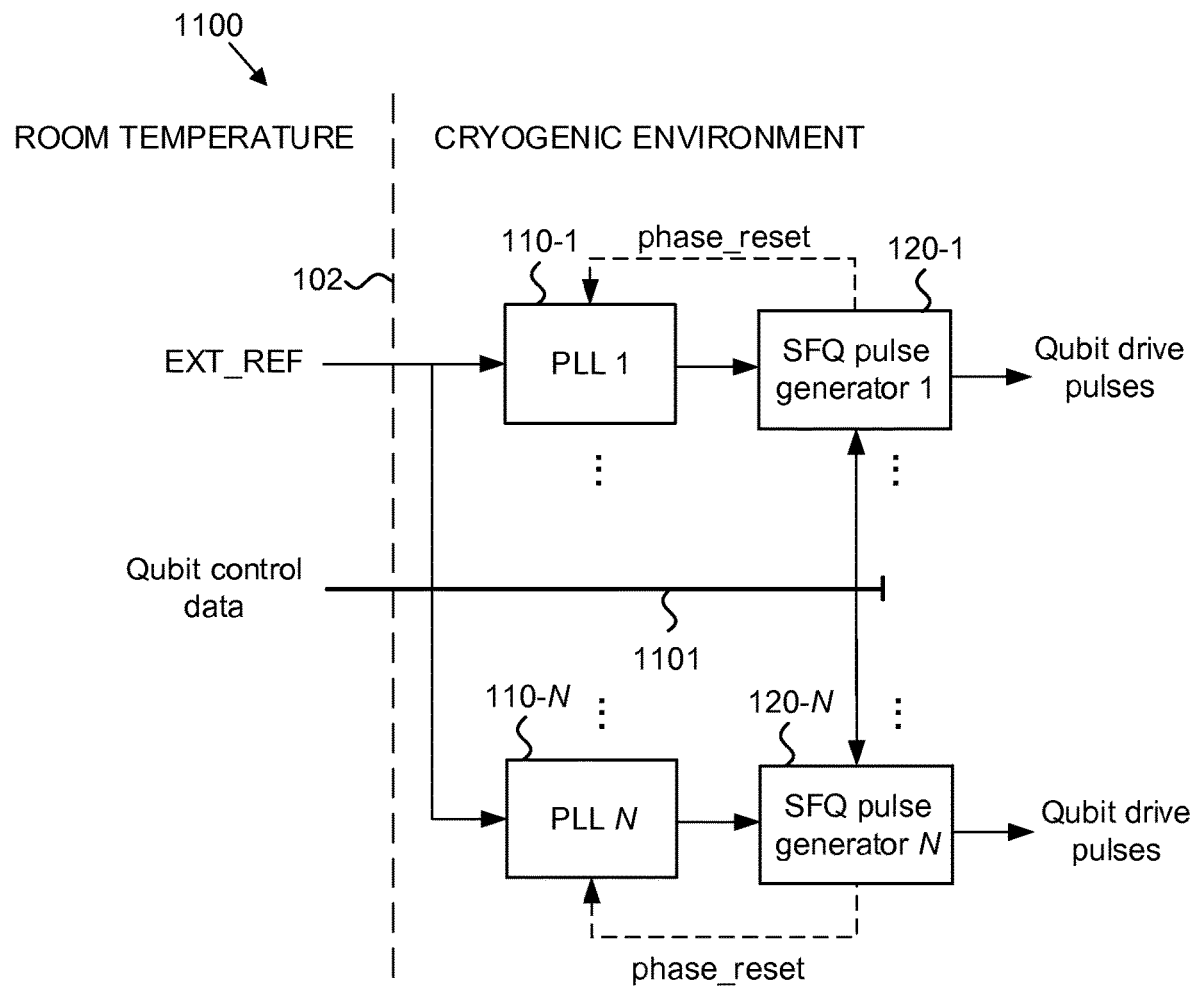
FIG. 11 illustrates an example of an apparatus comprising multiple phase locked loops for generating pulse clock signals for a plurality of qubits.

FIG. 11 illustrates an example of an apparatus comprising multiple phase locked loops for generating pulse clock signals for a plurality of qubits. The apparatus 1100 may comprise a quantum computer or a portion thereof, for example a module, a component, or a set of components configured to be applied at a quantum computer. The apparatus 1100 may comprise a plurality of PLLs 110-1 to 110-N. Each of the PLLs 110-1 to 110-N may be similar to PLL 110. The PLLs 110-1 to 110-N may receive a single reference frequency signal (EXT_REF) across the boundary 102, or, in general the number of the reference frequency signals may be lower than the number of PLLs 110-1 to 110-N. At least two of the PLLs 110-1 to 110-N may therefore receive the same reference frequency signal. Each of the PLLs 110-1 to 110-N may be configured to generate a pulse clock signal for a respective qubit, or a group of qubits, based on the reference frequency signal (EXT_REF). A plurality of pulse clock signals may be therefore generated by the PLLs 110-1 to 110-N based on the reference frequency signal for a plurality of qubits.

The apparatus 1100 may further comprise a plurality of SFQ pulse generators 120-1 to 120-N. Each of the SFQ pulse generators may be similar to the SFQ pulse generator 120. The SFQ pulse generators 120-1 to 120-N may be electrically coupled to respective PLLs 110-1 to 110-N. The SFQ pulse generators 120-1 to 120-N may be configured to generate respective qubit drive pulse sequences for the plurality of qubits based on the pulse clock signals received from the PLLs 110-1 to 110-N. The SFQ pulse generators 120-1 to 120-N may be further configured to reset the phases of the respective PLLs 110-1 to 110-N, as described for example with reference to FIG. 7.

The apparatus 1100 may receive qubit control data across the boundary 102 over a transmission medium 1101, such as for example a twisted conductor pair or a coaxial cable. Using single transmission medium at the boundary 102 enables to reduce the amount of heat leaking to the cryogenic environment, thereby improving quality of qubit operations. Communication on the transmission medium 1101 may be arranged in any suitable manner such that portions of the qubit control data may be addressed to the individual SFQ pulse generators 120-1 to 120-N. The transmission medium may comprise for example a parallel bus. Addressing the SFQ pulse generators 120-1 to 120-N individually may be implemented for example by a packet based data protocol, which identifies the particular SFQ pulse generator addressed, for example by an ID number. Alternatively, the apparatus 1100 may comprise demultiplexer (not shown) that demultiplexes data received over the single transmission medium 1101 to the different SFQ pulse generators 120-1 to 120-N. Regardless of the implementation, each of the SFQ pulse generators 120-1 to 120-N may receive a portion of the qubit control data. Each of the SFQ pulse generators 120-1 to 120-N may then generate its qubit drive pulse sequence based on the received portion of the qubit control data. The portion of the qubit control data may comprise quantum gate sequences for the qubit driven by the particular SFQ pulse generator. This reduces the amount of control electronics needed at the cryogenic environment. Furthermore, the different qubit channels may be operated at different frequencies, since the PLLs 110-1 to 110-N may operate at different frequencies. Problems associated with scaling up the number of qubit channels in quantum computing systems may be therefore alleviated.

Figure 12:
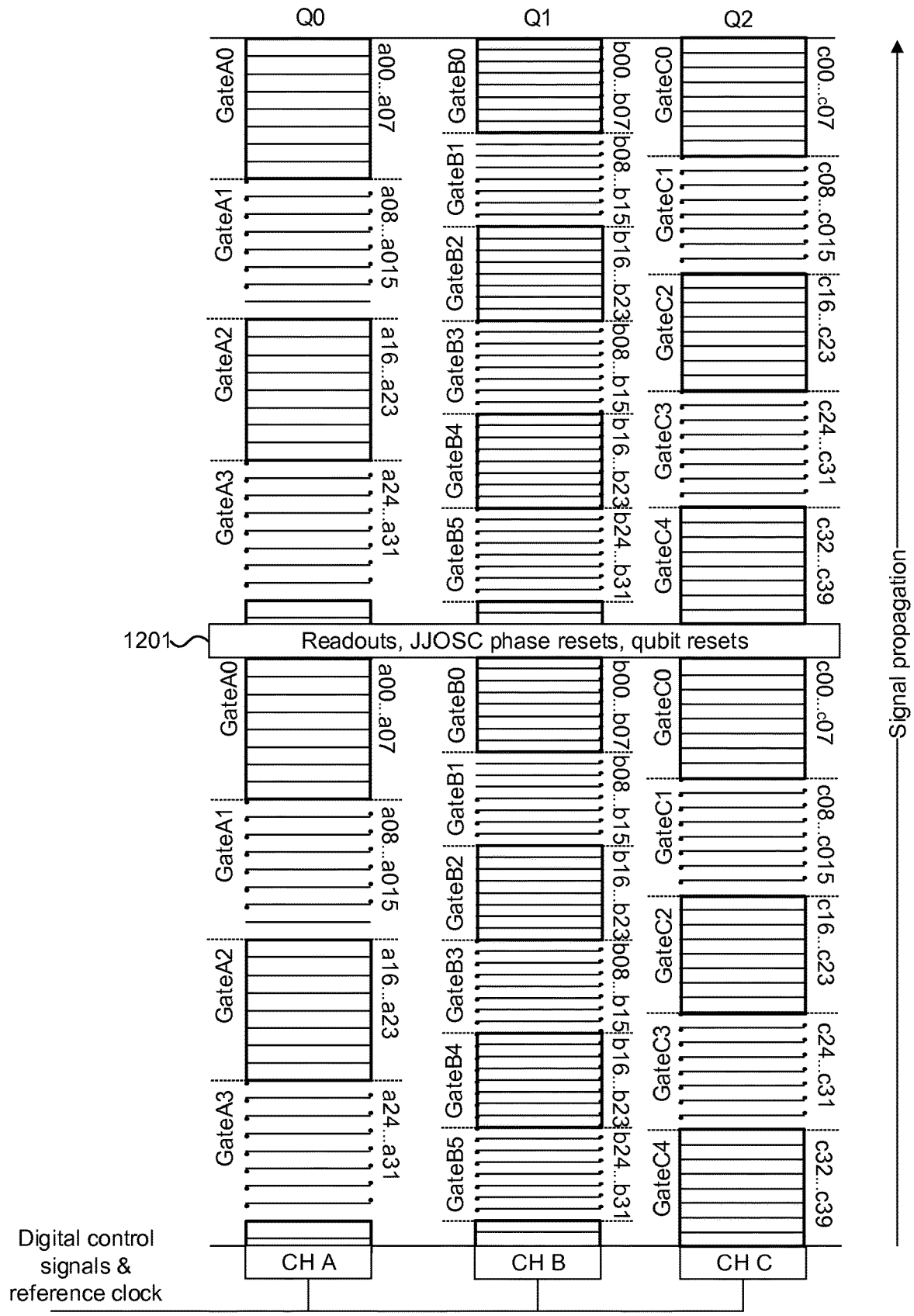
FIG. 12 illustrates an example of qubit gate sequences for three channels with different qubit frequencies.

FIG. 12 illustrates an example of quantum gate sequences f for three channels with different qubit frequencies. Digital control signals and a single reference clock (e.g. EXT_REF) may be provided for the three parallel channels Channel A (CH A), Channel B (CH B), and Channel (CH C). The direction of signal propagation is from the bottom to the top. Each channel may output flux pulse trains for one qubit. Each channel may be characterized by its own frequency, which may be an integer multiple of the resonance frequency of the respective qubit. The qubit frequencies correspond to "bit rates" of the channels. A "bit rate" of a channel corresponds to the SFQ_CLK frequency, which may be set to an integer multiple of the qubit frequency. So, for example if the SFQ_CLK runs t 16 times the qubit frequency, e.g. for a 4.51231 GHz qubit at 72.197 GHZ, the corresponding "bit rate" of the channel may be 72.197 Gbps, the "bits" corresponding to SFQ generated flux pulses at the output of the SFQ AWG core 120. The frequency of the channel may be called a fundamental frequency of the channel.

As illustrated in FIG. 12, Channel A has a first frequency, which enables four full quantum gates (GateA0 GateA1, GateA2, GateA3) to be provided before qubit readouts, JJOSC phase resets, and qubit resets at operation 1201. Channel B has a second frequency, which enables six full quantum gates (GateB0, GateB1, GateB2, GateB3, GateB4, GateB5) to be provided before the qubit readouts, the JJOSC phase reset, and the qubit resets. Channel C has a third frequency, which enables five quantum gates (GateC0, GateC1, GateC2, GateC3, GateC4) to be provided before the qubit readouts, the JJOSC phase resets, and the qubit resets. It is however noted that FIG. 12 provides a conceptual illustration of the channels and in practise the qubit frequency differences may be much smaller. Also, gate sequence length may be much longer (e.g. a thousand gates) and also the length of each gate may be much longer in terms of number of bits. Along with longer qubit lifetimes and development of error correction schemes, the length of the gate sequences may be also increased. For example, some algorithms may require a gate sequence of millions of individual gates with each gate comprising hundreds of flux pulses simultaneously on millions of qubits.

In the example of FIG. 12, gate sequences (e.g. GateA0 to GateA3) end in the readout and reset operation 1201 and the combination of gate sequences and the readout and reset operation 1201 may be repeated, for example thousands of times. A single gate may comprise a certain length flux pulse trains. In this example, the number of flux pulses per gate is eight, but a higher number (e.g. up to 256) flux pulses may be applied in practical implementations. Each gate may comprise a different "bit string", which may be however picked from a certain limited set of stored flux pulse trains. For example, the SFQ AWG core 120 may hold 64 different 64-"bit" flux pulse trains (gates) that may be output in an arbitrary order based on externally provided control signals that may be understood as "opcodes" of the quantum computer, analogously to classical computers. In this example, the SFQ AWG core 120 would have 64 different opcodes available for use in a program code. A gate may therefore correspond to an opcode (comprising many "bits" corresponding to flux pulses) of a classical computer. A gate sequence (comprising a number of gates) may correspond to a program of a classical computer (comprising many opcodes). Results of quantum algorithms are in general statistical and programs may be run many times to collect sufficient statistic and therefore the gate sequences may be repeated. Furthermore, gate lengths may be variable and consecutive gates may be separated by an interval that is not equal to the gate length. Instead, any integer "bit" separation between the gates may be applied.

The phase resets of the oscillators associated with the different channels enable synchronizing the phases of the qubit drive pulse sequences among the different channels. Therefore, after the phase resets, the "bits" may start simultaneously on the three channels. "Bits" of parallel channels may not necessarily end synchronously. This may be the case for example when the gate sequence ends due to different channels having different frequencies and having acquired different relative phases during the gate sequence.

The disclosed system therefore enables a large number of deterministically referenced and per qubit clocked parallel channels, which may be configured to output deterministic flux pulse trains corresponding to pre-programmed bit strings, resulting in long, programmable, repeatable, and well-controlled output.

Figure 13:
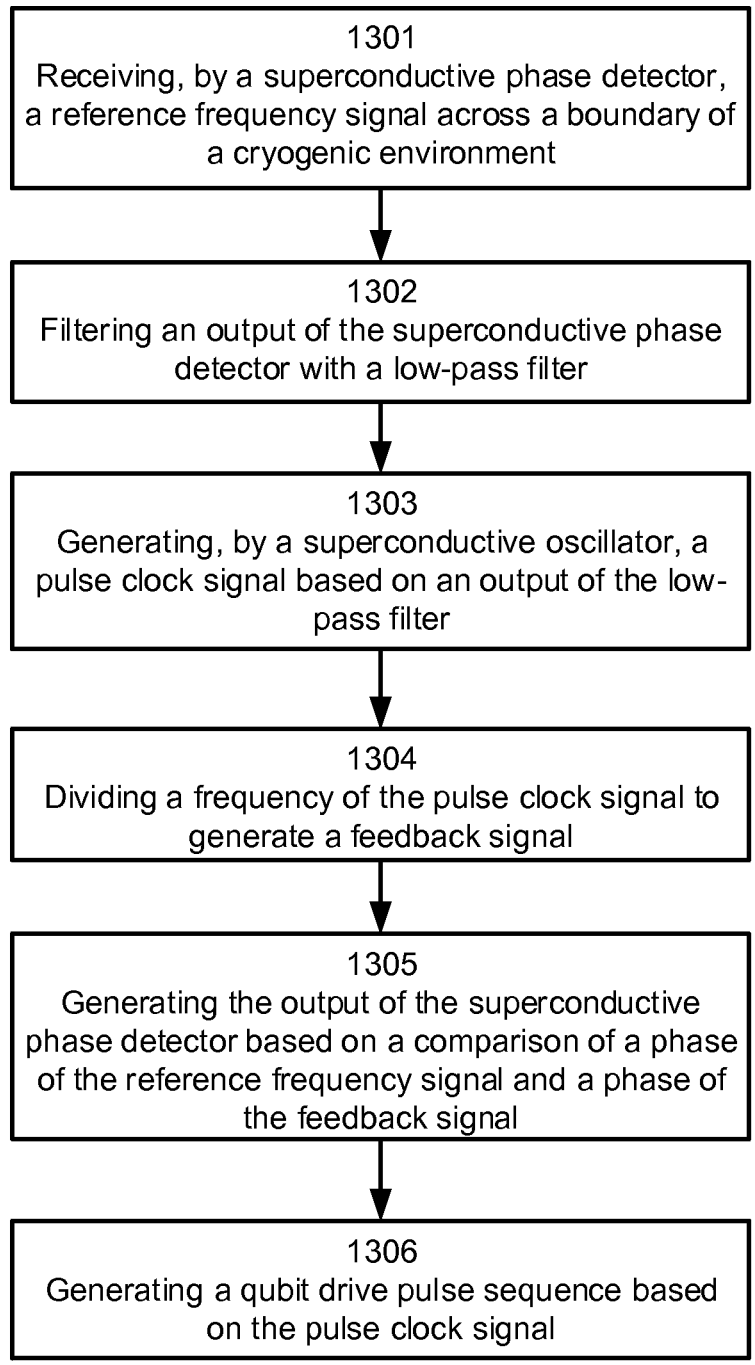
FIG. 13 illustrates an example of a method for qubit clock signal generation.

FIG. 13 illustrates an example of a method for qubit clock signal generation.

At 1301, the method may comprise receiving, by a superconductive phase detector, a reference frequency signal across a boundary of a cryogenic environment.

At 1302, the method may comprise filtering an output of the superconductive phase detector with a low-pass filter.

At 1303, the method may comprise generating, by a superconductive oscillator, a pulse clock signal based on an output of the low-pass filter.

At 1304, the method may comprise dividing a frequency of the pulse clock signal to generate a feedback signal.

At 1305, the method may comprise generating the output of the superconductive phase detector based on a comparison of a phase of the reference frequency signal and a phase of the feedback signal.

At 1306, the method may comprise generating a qubit drive pulse sequence based on the pulse clock signal.

Further features of the method directly result for example from the functionalities and parameters of the apparatuses 100, 700, or 1100 as described in the appended claims and throughout the specification, and are therefore not repeated here. Different variations of the method may be also applied, as described in connection with the various example embodiments. An apparatus may be configured to perform or cause performance of any aspect of the methods described herein. Further, an apparatus may comprise means for performing any aspect of the methods described herein.

Example embodiments of the present disclosure thus enable an arbitrary number of qubits to be controlled by SFQ based AWGs that are clocked from a single global clock. The global clock may be brought to the cryogenic environment (e.g. the mixing chamber) from the room temperature for example by using a single coaxial cable. Furthermore, digital control signals may be brought to the cryogenic environment from the room temperature over a single transmission medium, for example utilizing serialization. This alleviates the issues with complex cabling and wiring schemes and the power dissipation associated therewith. Providing dedicated SFQ based control electronics at the cryogenic environment also enables low-latency feedback, deeper level of integration, and scaling up the number of qubits to enable universal quantum computing.

It is further noted that with the advancement of technology, the example embodiments of the present disclosure may be implemented in various ways. The present disclosure is therefore not limited to the particular examples described above. Instead, implementations may vary within the scope of the claims.

The invention claimed is:

1. An apparatus, comprising:
   a superconductive phase detector configured to receive a reference frequency signal across a boundary of a cryogenic environment;
   a low-pass filter electrically coupled to an output of the superconductive phase detector;
   a superconductive oscillator electrically coupled to an output of the low-pass filter, wherein the superconductive oscillator is configured to generate a pulse clock signal based on the output of the low-pass filter;
   a frequency divider configured to divide a frequency of the pulse clock signal to generate a feedback signal, wherein the superconductive phase detector is configured to generate its output based on a comparison of a phase of the reference frequency signal and a phase of the feedback signal; and
   a pulse generator configured to generate a qubit drive pulse sequence based on the pulse clock signal.

2. The apparatus according to claim 1, wherein the pulse generator is configured to generate the qubit drive pulse sequence based on qubit control data received across the boundary of the cryogenic environment.

3. The apparatus according to claim 1, wherein the qubit drive pulse sequence comprises a quantum gate sequence, and wherein the pulse generator is configured to reset a phase of the pulse clock signal to the phase of the reference frequency signal at a beginning of the quantum gate sequence.

4. The apparatus according to claim 1, wherein the superconductive oscillator comprises a tunable Josephson junction oscillator.

5. The apparatus according to claim 4, wherein the pulse generator is configured to reset a phase of the pulse clock signal based on driving a bias current of the tunable Josephson junction oscillator substantially to zero.

6. The apparatus according to claim 1, wherein the frequency divider comprises an integer frequency divider, wherein a divisor of the integer frequency divider is configured to be delta-sigma modulated between at least two integer values.

7. The apparatus according to claim 1, wherein the pulse clock signal comprises a first plurality of single flux quantum pulses.

8. The apparatus according to claim 1, wherein the qubit drive pulse sequence comprises a second plurality of single flux quantum pulses.

9. The apparatus according to claim 1, wherein the superconductive phase detector comprises a superconductor-insulator- superconductor mixer or a single flux quantum exclusive-or gate.

10. The apparatus according to claim 5, wherein the low-pass filter is configured to substantially maintain its electric or electromagnetic state for a duration of the reset of the phase of the pulse clock signal.

11. The apparatus according to claim 10, wherein the duration of the reset of the phase of the pulse clock signal is shorter than $1/10f_c$ or $1/100f_c$, wherein $f_c$ is a cut-off frequency of the low-pass filter.

12. The apparatus according to claim 1, further comprising:
   a plurality of phase locked loops configured to receive the reference frequency signal and to generate a plurality of pulse clock signals for a plurality of qubits based on the reference frequency signal, wherein each of the plurality of pulse clock signals corresponds to an integer multiple of a resonance frequency of a respective qubit; and
   a plurality of pulse generators configured to generate a plurality of qubit drive pulse sequences for the plurality of qubits based on the plurality of pulse clock signals.

13. The apparatus according to claim 12, wherein each of the plurality of phase locked loops comprises an instance of the superconductive phase detector, an instance of the low-pass filter, an instance of the superconductive oscillator, and an instance of the frequency divider.

14. The apparatus according to claim 12, wherein each of the plurality of pulse generators is configured to receive a portion of qubit control data across the boundary of the cryogenic environment over a transmission medium and to generate the qubit drive pulse sequence based on the portion of qubit control data.

15. The apparatus according to claim 14, wherein the plurality of qubit drive pulse sequences comprises a plurality of quantum gate sequences.

16. The apparatus according to claim 14, wherein the transmission medium comprises a twisted conductor pair or a coaxial cable.

17. A method comprising:
receiving, by a superconductive phase detector, a reference frequency signal across a boundary of a cryogenic environment;
filtering an output of the superconductive phase detector with a low-pass filter;
generating, by a superconductive oscillator, a pulse clock signal based on an output of the low-pass filter;
dividing a frequency of the pulse clock signal to generate a feedback signal;
generating the output of the superconductive phase detector based on a comparison of a phase of the reference frequency signal and a phase of the feedback signal; and
generating a qubit drive pulse sequence based on the pulse clock signal.

18. The method according to claim 17, further comprising:
generating the qubit drive pulse sequence based on qubit control data received across the boundary of the cryogenic environment.

19. The method according to claim 17, wherein the qubit drive pulse sequence comprises a quantum gate sequence, and wherein the method further comprises resetting a phase of the pulse clock signal to the phase of the reference frequency signal at a beginning of the quantum gate sequence.

20. The method according to claim 17, wherein the superconductive oscillator comprises a tunable Josephson junction oscillator.

21. The method according to claim 20, further comprising:
resetting a phase of the pulse clock signal based on driving a bias current of the tunable Josephson junction oscillator substantially to zero.

22. The method according to claim 17, further comprising:
dividing the frequency of the pulse clock signal by an integer frequency divider, wherein a divisor of the integer frequency divider is delta-sigma modulated between at least two integer values.

23. The method according to claim 17, wherein the pulse clock signal comprises a first plurality of single flux quantum pulses.

24. The method according to claim 17, wherein the qubit drive pulse sequence comprises a second plurality of single flux quantum pulses.

25. The method according to claim 17, wherein the superconductive phase detector comprises a superconductor-insulator-superconductor mixer or a single flux quantum exclusive-or gate.

26. The method according to 17, further comprising:
receiving, by a plurality of phase locked loops, the reference frequency signal;
generating, by the plurality of phase locked loops, a plurality of pulse clock signals for a plurality of qubits based on the reference frequency signal, wherein each of the plurality of pulse clock signals corresponds to an integer multiple of a resonance frequency of a respective qubit; and
generating, by a plurality of pulse generators, a plurality of qubit drive pulse sequences for the plurality of qubits based on the plurality of pulse clock signals.

27. The method according to claim 26, further comprising:
receiving, by each of the plurality of pulse generators, a portion of qubit control data across the boundary of the cryogenic environment over a transmission medium; and
generating, by each of the plurality of pulse generators, the qubit drive pulse sequence based on the portion of qubit control data.

28. The method according to claim 27, wherein the plurality of qubit drive pulse sequences comprises a plurality of quantum gate sequences.

29. The method according to claim 27, wherein the transmission medium comprises a twisted conductor pair or a coaxial cable.

* * * * *